United States Patent [19]

Bland et al.

[11] Patent Number: 5,034,917

[45] Date of Patent: Jul. 23, 1991

[54] COMPUTER SYSTEM INCLUDING A PAGE MODE MEMORY WITH DECREASED ACCESS TIME AND METHOD OF OPERATION THEREOF

[76] Inventors: Patrick M. Bland, 4535 Palm Ridge Blvd., Delray Beach, Fla. 33445; Mark E. Dean, 5054 Beechwood Rd., Delray Beach, Fla. 33484

[21] Appl. No.: 196,721

[22] Filed: May 26, 1988

[51] Int. Cl.[5] .......................... G06F 7/00; G06F 8/00
[52] U.S. Cl. .................... 364/900; 364/957.1; 364/957; 364/971.1; 364/965; 364/965.8; 365/203; 365/235
[58] Field of Search ... 364/200 MS File, 900 MS File; 365/203, 235

[56] References Cited

U.S. PATENT DOCUMENTS

| | | | |
|---|---|---|---|
| 4,239,993 | 12/1980 | McAlexander, III et al. | 307/355 |
| 4,318,014 | 3/1982 | McAlister et al. | 307/463 |
| 4,422,160 | 12/1983 | Watanabe | 365/189 |
| 4,429,375 | 1/1984 | Kobayashi et al. | 365/240 |
| 4,581,721 | 4/1986 | Gunawardana | 365/230 |
| 4,623,986 | 11/1986 | Chauvel | 364/900 |
| 4,625,300 | 11/1986 | McElroy | 365/205 |
| 4,649,522 | 3/1987 | Kirsch | 365/189 |
| 4,658,381 | 4/1987 | Reed et al. | 365/203 |
| 4,722,074 | 1/1988 | Fujishima et al. | 365/203 |
| 4,727,517 | 2/1988 | Ueno et al. | 365/203 |
| 4,754,433 | 6/1988 | Chin et al. | 365/189 |
| 4,764,901 | 8/1988 | Sakurai | 365/189 |

FOREIGN PATENT DOCUMENTS 0145320 11/1984 European Pat. Off. .

Primary Examiner—Gareth D. Shaw
Assistant Examiner—Kevin A. Kriess
Attorney, Agent, or Firm—Mark P. Kahler

[57] ABSTRACT

A computer system is provided in which memory access time is substantially reduced. After row address strobe (RAS) and column address strobe (CAS) signals are used to select a particular address in a memory during a first memory cycle, the addressed data is latched for later transfer to a data bus. A CAS precharge of the memory is then conducted after such latching and prior to the end of the first memory cycle before the commencement of the second memory cycle.

5 Claims, 9 Drawing Sheets

BLOCK DIAGRAM OF ONE DATA BYTE

COMPUTER SYSTEM INCLUDING A PAGE MODE MEMORY WITH DECREASED ACCESS TIME AND METHOD OF OPERATION THEREOF

CROSS REFERENCE TO RELATED APPLICATION

This application is related to copending Gaudenzi et al U.S. patent application Ser. No. 07/198,981, filed May 26, 1988, entitled Bidirectional Buffer With Latch And Parity Capability, and assigned to the instant assignee.

BACKGROUND OF THE INVENTION

1. Field of the Invention

This invention relates in general to memories employed in computer systems and, more particularly, to accessing data stored in page mode memories employed in such systems.

2. Description of Related Art

The demands on computer systems to achieve ever greater operating speeds, increased effective processing power and greater overall performance continue. One trend has been to increase the clock frequency of the central processing unit (CPU) of the computer. This, of course, results in a greater number of instructions being processed per unit time. However, as clock frequency is increased, the access time associated with memory must somehow be correspondingly shortened if the full benefit of the clock frequency increase is to be realized. Otherwise, the access time associated with reading data out of memory becomes a prominent limiting factor constraining the effective performance of the CPU.

One approach to decreasing the effective access time required to read data from memory is to use page mode memory. That is, memory is divided into a plurality of pages, each page consisting of a row having a common row address for the entire row. Each row of a page includes a plurality of columns having corresponding column addresses. To access a particular piece of data stored in such a page mode memory, the row address of that data is supplied to the memory to enable selection of the page in memory where the data is located. Then, the column address associated with the data is supplied to the memory to enable selection of the particular piece of data within the addressed row or page. Typically, the addressed data is then read out to the data bus.

One example of a page mode memory is found in the IBM Personal System/2, Model 80 computer. (Personal System/2 is a trademark of the International Business Machines Corporation.) A simplified block diagram generally representative of such a page mode memory computer system is shown in FIG. 1 as system 10. System 10 includes a central processing unit (CPU) 20 or microprocessor to which an address bus 30 and a data bus 40 are coupled. System 10 further includes a memory controller 50 to which address bus 30 and data bus 40 are coupled. A control bus 60 is coupled between CPU 20 and memory controller 50 such that control signals may be passed therebetween. Memory controller 50 is coupled to at least one memory module 70 which consists of random access memory (RAM). In this example, memory module 70 is divided into pages which are 2K bytes long (512×32 plus parity), each page by definition having the same row address. Each page thus includes 2K column addresses. A data bus 80 is coupled between memory controller 50 and memory module 70 to permit the transfer of data therebetween.

A multiplexed MUX address bus 90 is coupled between memory controller 50 and memory module 70 so that row and column address information may be passed from memory controller 50 to memory module 70. Multiplexed address bus 90 has fewer lines than address bus 30 due to the multiplex nature of bus 90 on which a row or page address is first supplied to memory module 90 during a memory access cycle and then, second, a column address is supplied to memory module 90 later in that cycle. Memory controller 50 supplies Row Address Strobe (RAS) signals and Column Address Strobe (CAS) signals to memory module 70 as seen in FIG. 1. The nature of the RAS and CAS signals is described in the following discussion of the timing diagram of FIG. 2.

FIG. 2 shows a timing diagram of a typical memory cycle associated with computer system 10. For purposes of this example, it is assumed that CPU 20 desires to access or retrieve a first piece of data from memory 70 at a predetermined data address therein. To actually access such information, CPU 20 sends the data address to memory controller 50. Memory controller 50 effectively divides the data address into two portions, namely, the row address (also known as the page address) and the column address. The row address and the column address are multiplexed onto MUX ADDRESS bus 90. That is, the row address is first provided to such MUX ADDRESS bus at 100. The RAS signal is initially HIGH or OFF. It is noted that since negative logic is employed in the timing diagram of FIG. 2., HIGH corresponds to an OFF state and LOW corresponds to an ON state. The RAS signal goes ON at 105 to select the row address portion presently supplied to MUX ADDRESS bus 90. In this manner, memory module 70 selects the particular page (row) in which the addressed data is stored. RAS remains ON for the duration of the first memory cycle and the following second memory cycle.

After RAS goes ON and the row address is selected in the first memory cycle, the column address portion of the desired data is supplied to the MUX ADDRESS bus at 110. The CAS signal is then driven ON at 115 to select the column address portion presently supplied to MUX ADDRESS bus 90. At this point the address is complete since both the row and column address portions corresponding to the desired data have been supplied to memory module 70. Memory module 70 then accesses the data thus addressed and provides such data to memory data bus 80. The data on the memory data bus 80 becomes valid at 120 after a predetermined time delay, $T_D$, occurs after completion and selection of the address at 115. Microprocessor 20 then picks up the addressed data from data bus 40 of FIG. 1. Those skilled in the art use the term $T_{CAS}$ to define the time delay between the time at which CAS becomes active to the time at which the data becomes valid on the memory data bus 80. The term $T_{RAS}$ refers to the time delay between the time at which RAS becomes active to the time at which the data becomes valid. More commonly, $T_{RAS}$ is referred to as the "access time" exhibited by a particular memory device. For example, a memory device with an 80 nanosecond access time exhibits a $T_{RAS}$ of 80 nanoseconds.

For purposes of this example it is assumed that a second piece of data located in the same page or row as the above first piece of data is to be accessed from memory module 70. Those skilled in the art use the term "pipelining" to describe the act of changing the address, for example the column address portion, prior to the end of the current memory cycle in preparation for the next memory cycle. Pipelining itself saves time since it permits address decoding circuitry in memory controller 50 to start processing the address earlier than would otherwise be possible. An example of such pipelining is seen in FIG. 2 where subsequent to the data becoming valid at 120 and prior to the end of the first memory cycle at 125, the column address is changed to a new column address at 130, such column address corresponding to the second piece of data. Since the second piece of data to be accessed in the second memory cycle is in the same page as the data accessed in the first memory cycle, the column address portion changes at 130 while the row address portion remains the same. This situation is referred to as a "page hit". Since it is not necessary to resend the row address portion to memory module 70 when a "page hit" occurs, valuable time can be saved in a page mode memory arrangement.

Before memory module 70 can select and actually use the column address information now present on MUX ADDRESS bus 90, it is necessary to drive the CAS signal OFF for a predetermined period of time referred to as the CAS precharge 135. Those skilled in the art refer to the CAS precharge time as $T_{CRP}$. For a memory device with an 80 nanosecond access time, a typical value of $T_{CRP}$ would be 15 nanoseconds. Once the CAS precharge is completed, CAS is driven ON again at 140 such that the column address portion of the second piece of data is selected by memory module 70. The address of the second piece of data is thus completed and the data on memory address bus 80 becomes valid at 145 after a predetermined time delay, $T_D$, from completion and selection of the address at 140. Microprocessor 20 then picks up the addressed data from data bus 40 of FIG. 1. The second memory cycle ends at 150.

For purposes of this example it is assumed that a third piece of data located in a different page or row than the first and second pieces of data is accessed in a third memory cycle commencing at 150, a portion of such third memory cycle being shown in FIG. 2. This situation is referred to as a "page miss". That is, a new row address portion corresponding to the location of the third piece of data must be provided to memory module 70. Such new row address portion appears on the MUX ADDRESS bus via pipelining at 155. At the beginning 150 of the third memory cycle, RAS is driven OFF in preparation for the new row address. The new row address is actually selected when RAS is driven ON at 160. The remainder of the third memory cycle is substantially similar to the first memory cycle in FIG. 2 with CAS precharge being provided at 165 near the beginning of the third memory cycle.

From the above discussion it is seen that in the situation where a "page hit" occurs in a page mode memory, a substantial amount of time is consumed (reference the second memory cycle in FIG. 2) in conducting the CAS precharge before the new column address portion can be used to complete the new address and select the corresponding data.

As mentioned above, computer systems are being designed with higher and higher clock speeds. Given that a memory cycle consists of a predetermined number of clock pulses which become correspondingly shorter as the clock speed increases, the time required for such memory set-up activities as CAS precharge tends to occupy an ever increasing proportion of the memory access cycle as the clock speed increases. One way to accommodate a microprocessor which is operating at a very fast rate with respect to the speed or access time of memory is to add wait states to the computer system to effectively slow down the microprocessor to wait for data to be accessed from memory. This course of action is generally undesirable because it negates some of the benefits of increasing the clock speed of the microprocessor.

BRIEF SUMMARY OF THE INVENTION

One object of the present invention is to provide a computer system which is capable of operating at high clock speeds without resorting to additional wait states while accessing memory.

Another object of the present invention is to decrease the access time associated with page mode memories.

In accordance with one embodiment of the invention, a computer system is provided including a page mode memory having an address bus and a data bus coupled thereto. A processor, for example a microprocessor, is coupled to the address bus and the data bus. The processor processes data in the system and provides the memory with a first address signal during a first memory cycle, such first address signal corresponding to a location in memory of data to be accessed. The system includes a first control circuit coupled to the memory for supplying the memory with a row address strobe (RAS) signal during the first memory cycle and further includes a second control circuit coupled to the memory for supplying a column address strobe (CAS) signal to the memory during the first memory cycle and subsequent to the RAS signal. A latching circuit is coupled between the memory and the data bus for latching the data thus addressed for later transfer on the data bus. The computer system includes a CAS precharge circuit coupled to the memory for subjecting the memory to a CAS precharge subsequent to latching the memory and prior to the end of the first memory cycle.

DETAILED DESCRIPTION OF THE INVENTION

Figure 3:
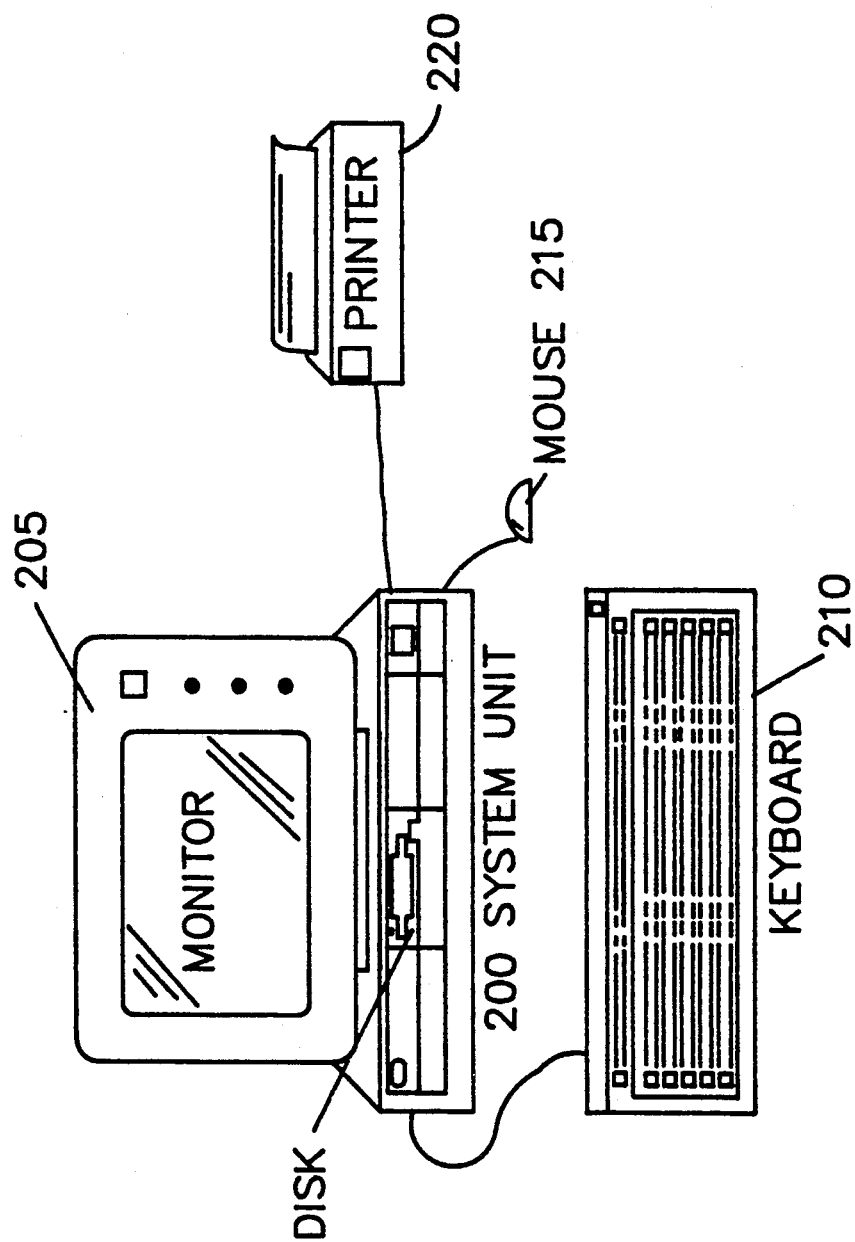
FIG. 3 is a simplified graphic representation of the computer system of the present invention.

FIG. 3 shows a simplified representation of the computer system of the present invention as including a computer system unit 200 to which a monitor 205, a keyboard input device 210, a mouse input device 215 and a printer output device 220 are coupled.

Figure 4:
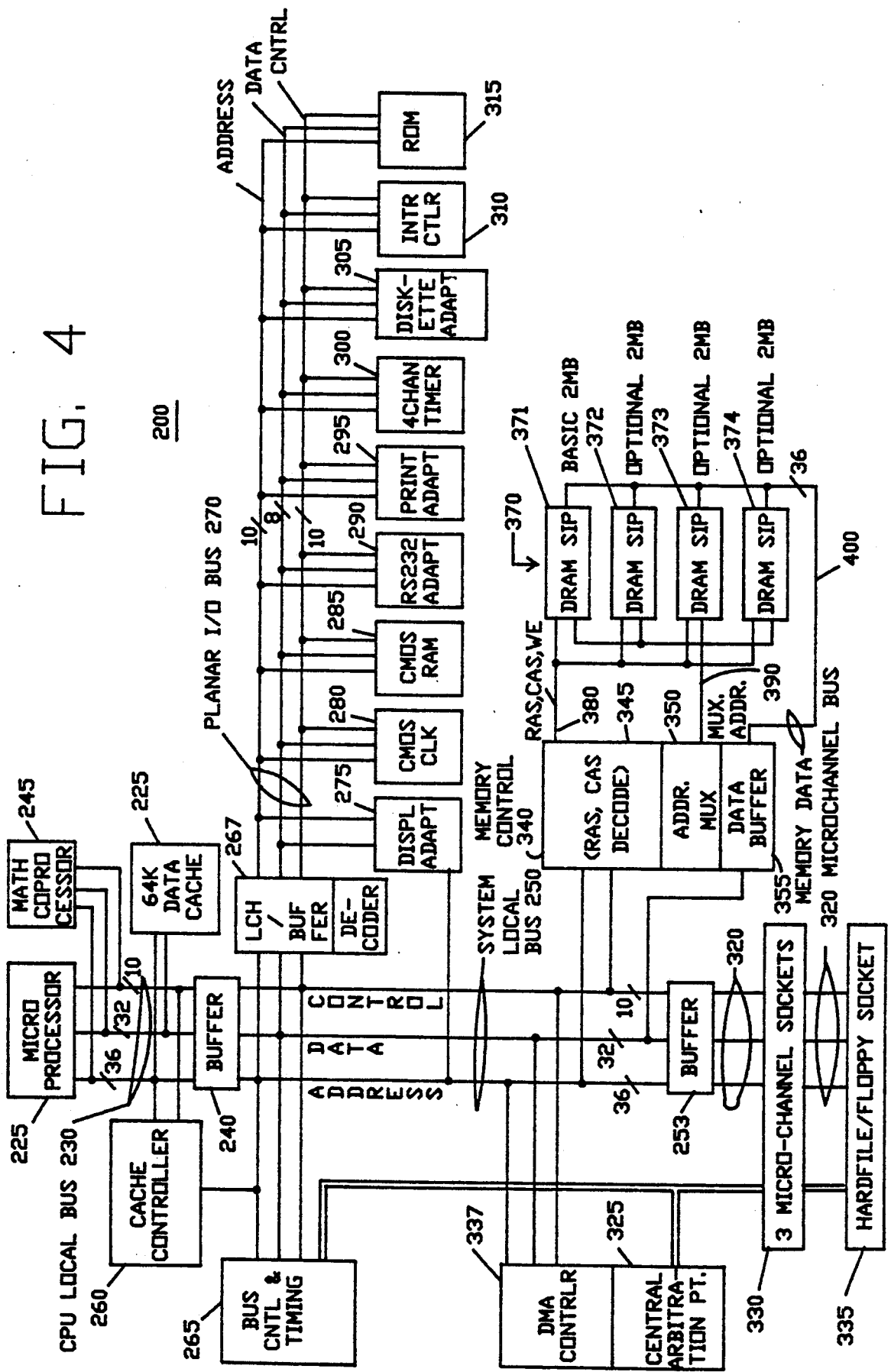
FIG. 4 is a block diagram of the computer system of the present invention.

FIG. 4 is a block diagram of computer system unit 200. System unit 200 includes a processor 225, for example a 32 bit processor such as the Intel 80386 processor. A CPU local bus 230 is formed by a 36 bit address bus, a 32 bit data bus and a 10 bit control bus which are coupled between processor 225 and a buffer 240 as shown in FIG. 4. A math coprocessor 245 such as the Intel 80387 coprocessor is coupled to CPU local bus 230 to perform floating point operations to enhance system throughput.

System unit 200 includes a system local bus 250 coupled between buffer 240 and a buffer 253. The system local bus 250 includes a data bus, an address bus and a control bus as shown in FIG. 4. Buffer 240 acts to buffer the address bus of CPU local bus 230 with respect to the address bus of system local bus 250. Buffer 240 also buffers the data bus and control bus of the CPU local bus 230 with respect to the data bus and control bus of system local bus 250. A CPU data cache 255, for example a data cache including 64K of memory, is coupled to the address and data busses of CPU local bus 230. A cache controller 260 such as the Intel 82385 cache controller, for example, is coupled to the address and control busses of CPU local bus 230. Cache controller 260 controls the storage and access of frequently used data which is stored in data cache 255 to effectively speed up the operation of system unit 200. Cache controller 260 is also coupled to the address bus of system local bus 250.

System unit 200 includes a bus control and timing circuit 265 coupled to the address, data and control busses of the system local bus 250. The system local bus 250 is coupled via a latch/buffer/decoder 267 to an input/output (I/O) bus 270 which includes a 10 bit address bus, an 8 bit data bus and a control bus. Buffer/decoder 267 provides I/O address latch and I/O data buffer steering control. Buffer/decoder 267 decodes the system local bus address and control signals, and provides "chip select" and I/O command signals to the I/O bus 270. It will be appreciated that "chip select" refers to selecting the particular device coupled to I/O bus 270 at which an operation is to be performed. I/O bus 270 is coupled to a display adapter 275, a CMOS clock 280, a CMOS RAM 285, an RS232 adapter 290, a printer adapter 295 and, a 4 channel timer 300 for general timekeeping functions. I/O bus 270 is further coupled to a diskette adapter 305, an interrupt controller 310 and a read only memory (ROM) which contains the system Basic Input Output System (BIOS).

A Micro Channel (TM) bus 320 having address, data and control buses therein is coupled to system local bus 250 via buffer 253. The architecture of the Micro Channel bus is described in more detail in the IBM PS/2 Model 80 Technical Reference Manual. In accordance with the Micro Channel architecture, a central arbitration control point (CACP) 325 is coupled to Micro Channel bus 320 and bus control and timing circuit 265 for purposes of managing the Micro Channel multi device bus arbitration mechanism. The connection of such central arbitration control point 325 and bus control and timing circuit 265 actually forms part of the Micro Channel bus 320.

A plurality of Micro Channel sockets 330 are coupled to Micro Channel bus 320 as shown in FIG. 4 for receiving feature cards such as memory cards, video adapters, DASD adapters, SCSI adapters and communications adapter cards. One or more hardfile/floppy disk sockets 335 are coupled to Micro Channel bus 320 to facilitate connection of a hard disk or floppy disk (not shown) to bus 320. A direct memory access (DMA) controller 337 is coupled to the address, data and control busses of system local bus 250 for the purpose of permitting peripherals such as hard files, floppy disk drives and any Micro Channel DMA slave devices to have direct access to main memory (described below) to avoid having to directly involve processor 225 in data transfers between such peripherals and main memory.

Figure 5A:
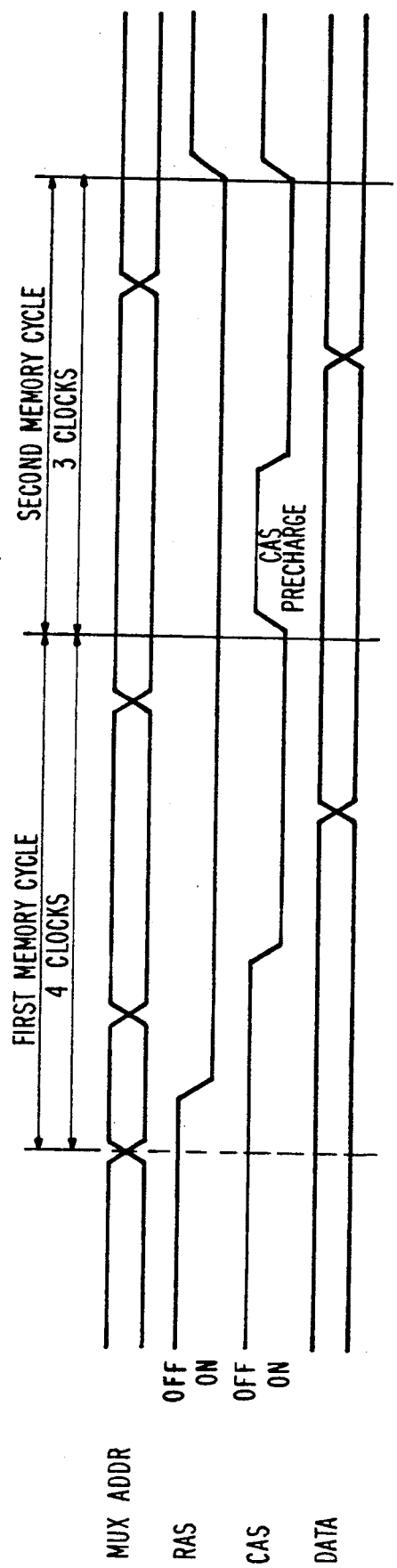
FIG. 5 is a timing diagram showing the timing of the memory portion of the computer system of FIG. 3 as compared with timing of the memory portion of the conventional system of FIG. 2.

A memory control circuit 340 is coupled to system local bus 250 as shown in FIG. 4. The operation of memory control circuit 340 is fully described and specified in the timing diagram of FIG. 5, described later. However, to enhance understanding of memory control circuit 340, it is noted that memory control circuit 340 actually includes three portions, that is, a RAS/CAS decoder 345, an address decoder/multiplexer 350 and a data buffer 355. RAS/CAS decoder 345 is coupled at its input to the control bus of system local bus 250. RAS/CAS decoder 345 takes address and bus cycle definition signals from processor 225 and decodes them to extract memory select and memory timing signals. RAS/CAS decoder 345 decodes RAS and CAS signals. The RAS signal decoded by decoder 345 specifies which memory bank, of 8 memory banks, (each bank including 1 megabyte organized as $256K \times 36$ bits) is to be accessed during the current memory cycle. The arrangement of these 8 memory banks into a memory 370 including modules 371, 372, 373 and 374 is described later. The CAS signal decoded by decoder 345 specifies which byte or bytes of a 32 bit word stored in memory 370 are to be accessed during the current memory cycle.

Memory control circuit 340 is coupled to the aforementioned memory 370 in the manner described subsequently. Memory 370 includes 4 modules of random access memory (RAM), namely modules 371, 372, 373 and 374 each of which accommodates 2 megabytes of memory. In FIG. 4, modules 371-374 are designated as dynamic random access memory (DRAM) single inline packages (SIP) or DRAM SIP. Module 371 is populated with 2 Megabytes of memory and is labelled "BASIC 2MB". The remaining modules 372-374 are fillable with memory at the user's option and are thus labelled "OPTIONAL 2MB". The RAS/CAS decoder 345 includes an output bus 380 having 13 separate lines on which the RAS, CAS and WE signals are transmitted to each of memory banks 371-374 of which 8 lines are dedicated to RAS, 4 lines are dedicated to CAS and 1 line is dedicated to WE. RAS/CAS decoder 345 generates a write enable (WE) signal which designates whether a particular memory cycle is a read cycle or a write cycle and provides that information to memory 370. Each of modules 371-374 includes 2 megabytes of memory each megabyte of which is divided into 512 pages or rows which are 2K bytes long each. That is, banks 371-374 are configured as page mode memories.

Address multiplexer (ADDR MUX) 350 is coupled at its input to the 36 line data bus of system local bus 250. When processor 225 desires to access a piece of data stored in a location in memory 370, processor 225 transmits the 36 bits of the address of that memory location to address multiplexer 350. Address multiplexer 350 derives the page address (row address) and column address from the 36 bit address information and provides the page address and column address to memory 370 via a multiplexed address (MUX ADDR) bus 390 which couples address multiplexer 350 to memory 370. A 36 bit memory data bus 400 couples memory modules 371–374 of memory 370 to data buffer 355. After memory 370 is addressed as above, the data at the specified memory address is transferred to a memory data bus 400 which supplies the data to data buffer 355 as shown in FIG. 4. On memory data bus 400, 32 bits ($D_0$–$D_{31}$) are dedicated to data and 4 parity bits ($P_0$–$P_3$) are dedicated to parity. Once the addressed data reaches memory data bus 400, the data is buffered by data buffer 355 and is then placed on the data bus of system local bus 250. Subsequently, the data is passed to processor 225 via buffer 240 and CPU local bus 230.

Figure 1:
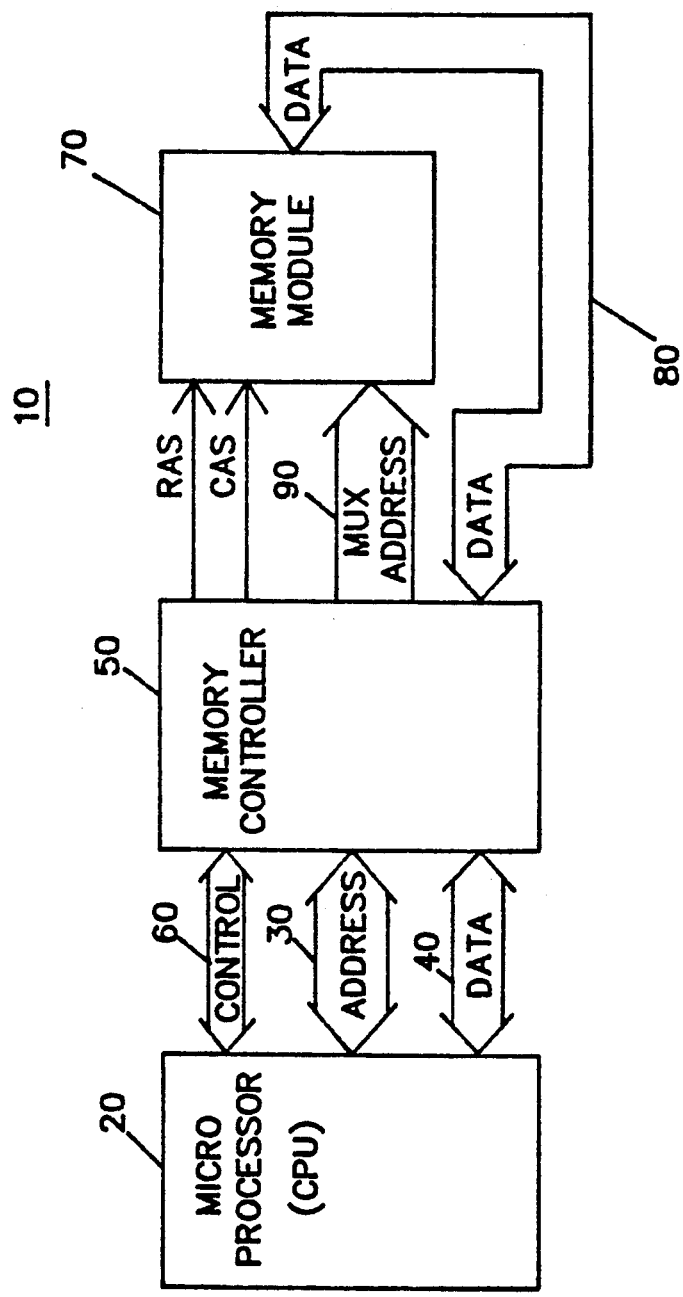
FIG. 1 is a simplified block diagram of a conventional computer system with a page mode memory.
Figure 2:
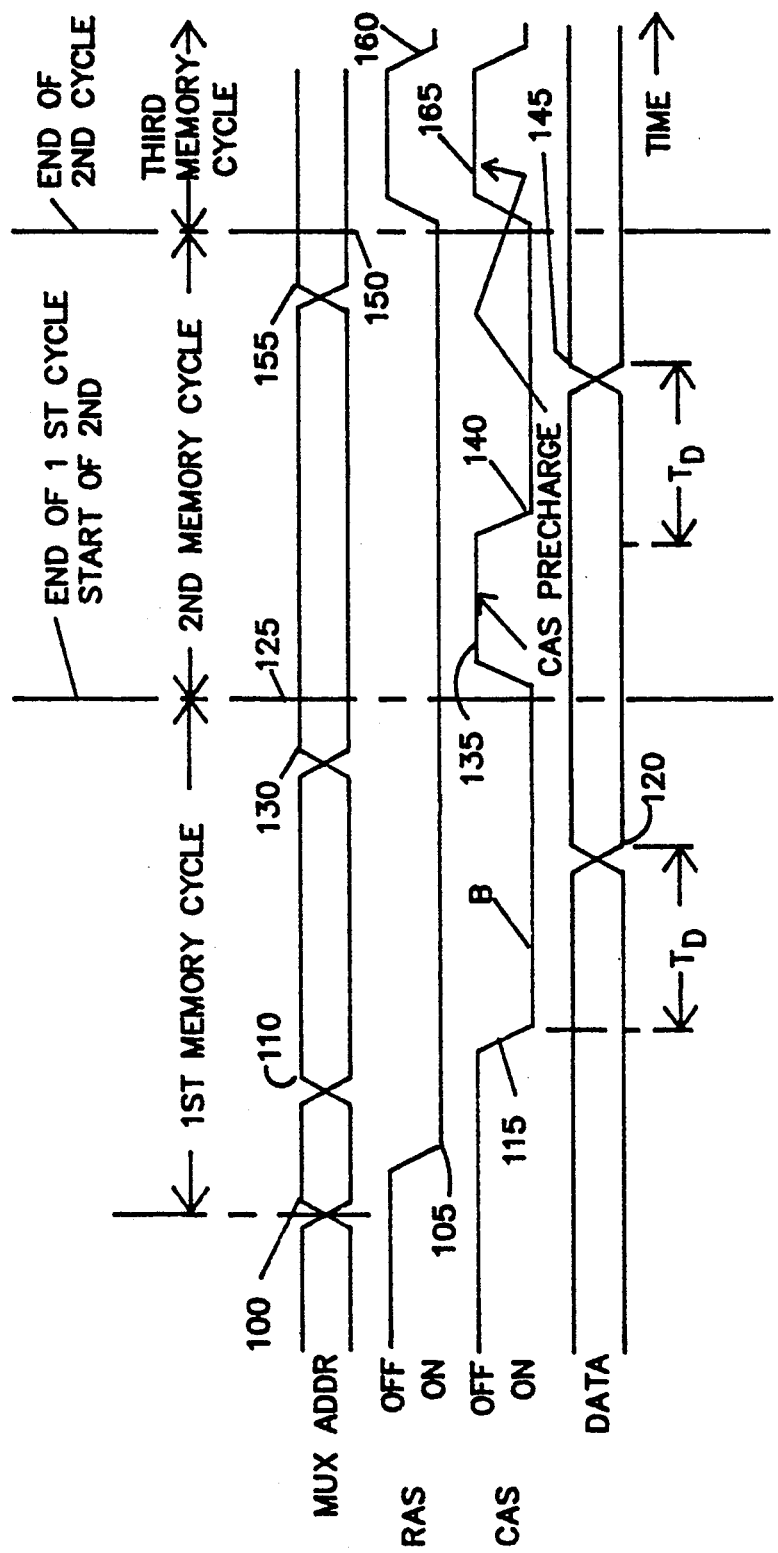
FIG. 2 is a timing diagram associated with one typical conventional page mode memory.
Figure 5B:
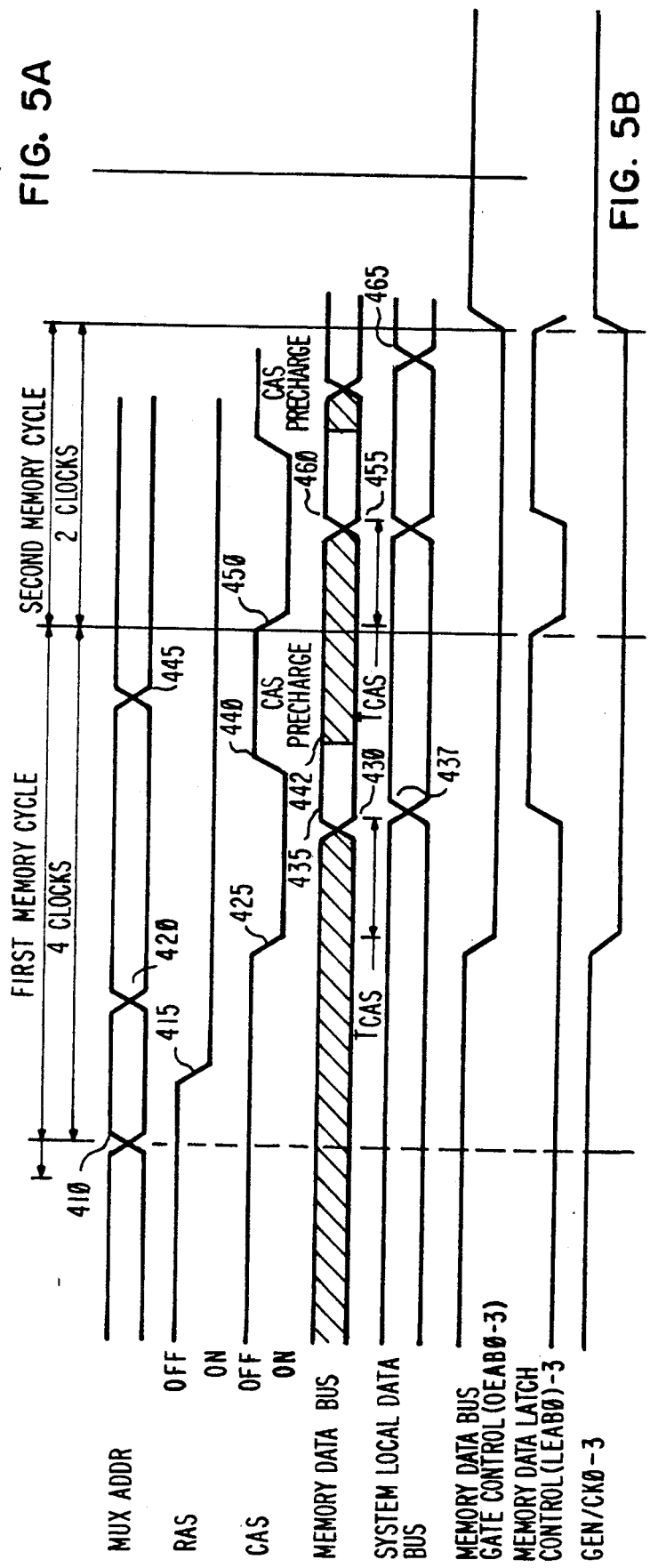

The following discussion of the timing diagram of FIG. 5B describes in detail the operation of memory control circuit 340 and memory 370. For convenience and to permit ready comparison, the prior art timing diagram of FIG. 2 has been repeated in the upper portion of FIG. 5 as FIG. 5A. For purposes of discussion of the timing diagram of FIG. 5B, it is assumed that processor 225 desires to access a piece of data stored at a selected address or location in memory 370. This piece of data is referred to as the first selected piece of data. It also assumed that after accessing the first selected piece of data, processor 225 desires to access a second selected piece of data at another memory location.

Processor 225 outputs the selected address at which the first piece of data is stored to the data bus of CPU local bus 230. The selected address consists of 32 address bits $A_0$–$A_{31}$ and 4 byte enable bits ($BE_0$–$BE_3$) bits, thus forming a 36 bit address in total. The 4 byte enable bits $BE_0$–$BE_3$ are used to indicate which bytes (from 1 to 4) are to be retrieved from the (4 byte, 32 bit) data stored at a particular address. After arriving on the address bus of the CPU local bus 230, the selected address is buffered by buffer 240. The selected address is then transferred to the address bus of system local bus 250 and provided to memory control circuit 340 and address multiplexer 350.

System unit 200 is arranged in this embodiment such that 9 bits of that 36 bit selected address correspond to the page address or row address (RAS address) 410 of the data to be accessed. That is, bits $A_{11}$–$A_{19}$ correspond to the RAS address. Page address 410 is timed to begin at the start of the first memory cycle as indicated in FIG. 5B. Address multiplexer 350 extracts this 9 bit page address 410 from the 36 bit address and provides this 9 bit page address 410 to memory 370 via a 9 line MUX ADDR (multiplexed address) bus 390 which couples address multiplexer 350 to memory 370.

At the beginning of the first memory cycle, the RAS signal from memory control circuit 340 is high which corresponds to an OFF state in the negative logic convention employed in FIG. 5B. After the page address 410 appears on MUX ADDR bus 390, memory control circuit 340 (via RAS/CAS decode circuit 345) drives RAS low or ON at 415 as seen in FIG. 5B. In this manner the page address to be used by memory 370 to access the specified data is provided to memory 370.

After RAS has gone ON, memory control circuit 370, via address multiplexer 350, extracts the 9 bit column address 420 of the data from the 36 bit address and provides that 9 bit column address 420 to memory 370 via MUX ADDR bus 390.

That is, bits $A_2$–$A_{11}$ correspond to such column address or (CAS) address. As seen in the timing diagram of FIG. 5B, after the column address 420 appears on MUX ADDR bus 390, memory control circuit 340 (via RAS/CAS decode circuit 345) drives CAS low or ON at 425. In this manner the column address to be used by memory 370 to access the specified data is provided to memory 370. The page address and the column address of the data are thus multiplexed onto the same 9 line MUX ADDR bus 390. The remaining bits $A_{17}$–$A_{31}$ are employed by the RAS decoder 345 to indicate which one of modules 371–374 contains the first piece of data which is being addressed.

At this point both the page address 410 and the column address 420 specifying the location in memory of the selected data have been provided to memory 370. After a predetermined time delay $T_{CAS}$ from the time CAS is activated or goes low, the data on memory data bus 400 becomes valid at 430. The data is then immediately latched at 435 by bidirectional latches (described later in more detail) contained in data buffer 355. After the buffering/latching action of data buffer 355 has occurred, the latched data (the first selected piece of data) is provided at 437 to the data bus of system local bus 250 for transfer to processor 225.

Subsequent to latching the data at 435 in the first memory cycle (current memory cycle) and prior to the commencement of the second memory cycle (next memory cycle), a CAS precharge is conducted at 440. Once the CAS precharge is commenced at 440, the data on memory data bus 400 becomes invalid at 442 after a predetermined period of time has passed from the commencement of CAS precharge. The latching circuits in data buffer 355 latch the data before it becomes invalid, that is, before 442 on the memory data bus timing diagram of FIG. 5B. Those periods of time during which the data on memory data bus 400 is invalid are indicated by cross-hatching on FIG. 5B. The end of the CAS precharge defines the end of the first memory cycle.

Processor 225 transmits the address of the second selected piece of data to memory control circuit 340 along the same data path as that over which the first selected piece of data travelled thereto. If memory control circuit 340 determines that the second selected piece of data to be fetched from memory 370 is in the same page as the first selected piece of data, then as seen in the timing diagram of FIG. 5B, during the CAS precharge at 440, the column address supplied to MUX ADDR bus 390 is changed to the column address of that second piece of data at 445. This column address change occurs before the end of the first memory cycle.

Subsequent to this column address change, the CAS precharge is finished and CAS is driven ON thus starting the second memory cycle at 450. The column address corresponding to the second selected piece of data is thus provided to memory 370. After a time delay $T_{CAS}$, the data corresponding to that column address and the already prescribed page address becomes valid at 455 on memory data bus 400.

The data is then immediately latched at 460 by the bidirectional latches contained in data buffer 355. After the buffering/latching action of data buffer 355 has occurred, the latched data (now the second selected piece of data) is provided at 465 to the data bus of system local bus 250 for transfer to processor 225.

As will be described in more detail subsequently in the discussion of data buffer 355, when the memory data latch control signal (LEAB0-3) is low, buffer 355 operates in a transparent or passthrough mode. When the memory data latch control signal is high, buffer 355 is storing data by latch action.

The above discussion has described memory access in the situation where the second selected piece of data is in the same page as the first selected piece of data. However, if memory control circuit 340 determines that the second selected piece of data is not in the same page as the first selected piece of data, then the memory addressing process must start all over again at the beginning of the first memory cycle. That is, since the row address or page address is not the same for the second piece of data as it was for the first piece of data, the new row address corresponding to the second piece of data must be transmitted to memory 370 followed by the new column address in a manner similar to that shown in the first memory cycle of the timing diagram for the invention shown in FIG. 5B.

Figure 6:
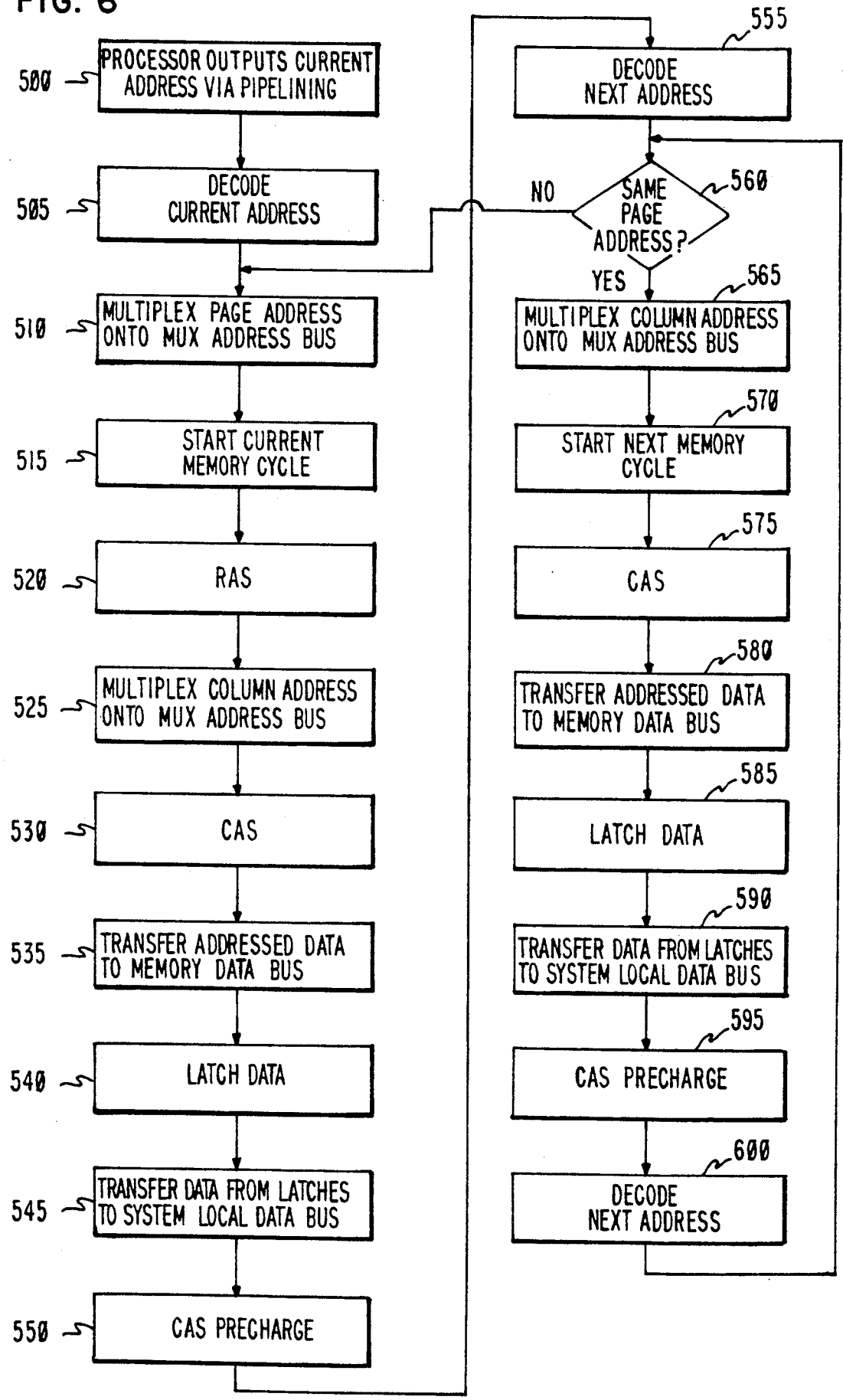
FIG. 6 is a flowchart showing how memory accesses are implemented in the computer system of the present invention.

FIG. 6 is a flowchart which summarizes the process by which memory accesses are conducted in system unit 200. A memory access begins when processor 225 employs address pipelining to output a current address at which data is to be retrieved as per block 500 in the flowchart. The current address is transferred to memory control circuit 340 by the bus structure in system unit 200 in the manner already described. The current address is decoded by memory control circuit 340 as per block 505. That is, a page address and a column address are extracted from the current address.

The page address is then multiplexed onto the MUX address bus 390 as per block 510, this event signifying the start of the current memory cycle as per block 515. The RAS is then activated or turned on at block 520 such that memory 370 selects the page address which is presently provided thereto on MUX address bus 390. The column address is then multiplexed onto the MUX address bus 390 as per block 525. The CAS is activated or turned on at block 530 such that memory 370 selects the column address which is presently provided thereto on MUX address bus 390. At this point the address of the desired data stored in memory 370 is completely specified and memory 370 transfers the data at the specified address to memory data bus 390 as per block 535. The data is latched by the bidirectional latches in data buffer 355 as per block 540 to preserve such data momentarily. After the data is latched, the data is transferred to system local data bus 250 as per block 545. A CAS precharge is then conducted as per block 550 prior to the end of the current memory cycle. The next address to be accessed is then decoded as per block 555.

A test is conducted in decision block 560 to determine if the next address is located in the same page as that in which the prior address (formerly the current address above) was located. If the next address is not in the same page as the prior address, then process flow continues back to block 510 of FIG. 6 at which the next page address is multiplexed onto MUX address bus 390. However, if the next address is located in the same page as the prior address, then process flow continues to block 565 at which the column address of the next address is multiplexed onto MUX address bus 390. Subsequently, the next memory cycle or second memory cycle is started at block 570 once the CAS precharge has ended. That is, at the beginning of the second memory cycle, CAS is activated or turned on as per block 575 such that memory 370 selects the column address which is presently provided thereto on MUX address bus 390. At this point the address of the desired data stored in memory 370 is once again completely specified and memory 370 transfers the data at the specified address to memory data bus 390 as per block 580. The data is latched by the bidirectional latches in data buffer 355 as per block 585 to preserve such data momentarily. After the data is latched, the data is transferred to system local data bus 250 as per block 590. A CAS precharge is then conducted as per block 595 prior to the end of the current memory cycle. The next address to be accessed is then decoded as per block 600 after which flow continues back to decision block 560 at which a decision is again made to determine if the next address is in the same page as the last address.

Figure 7:
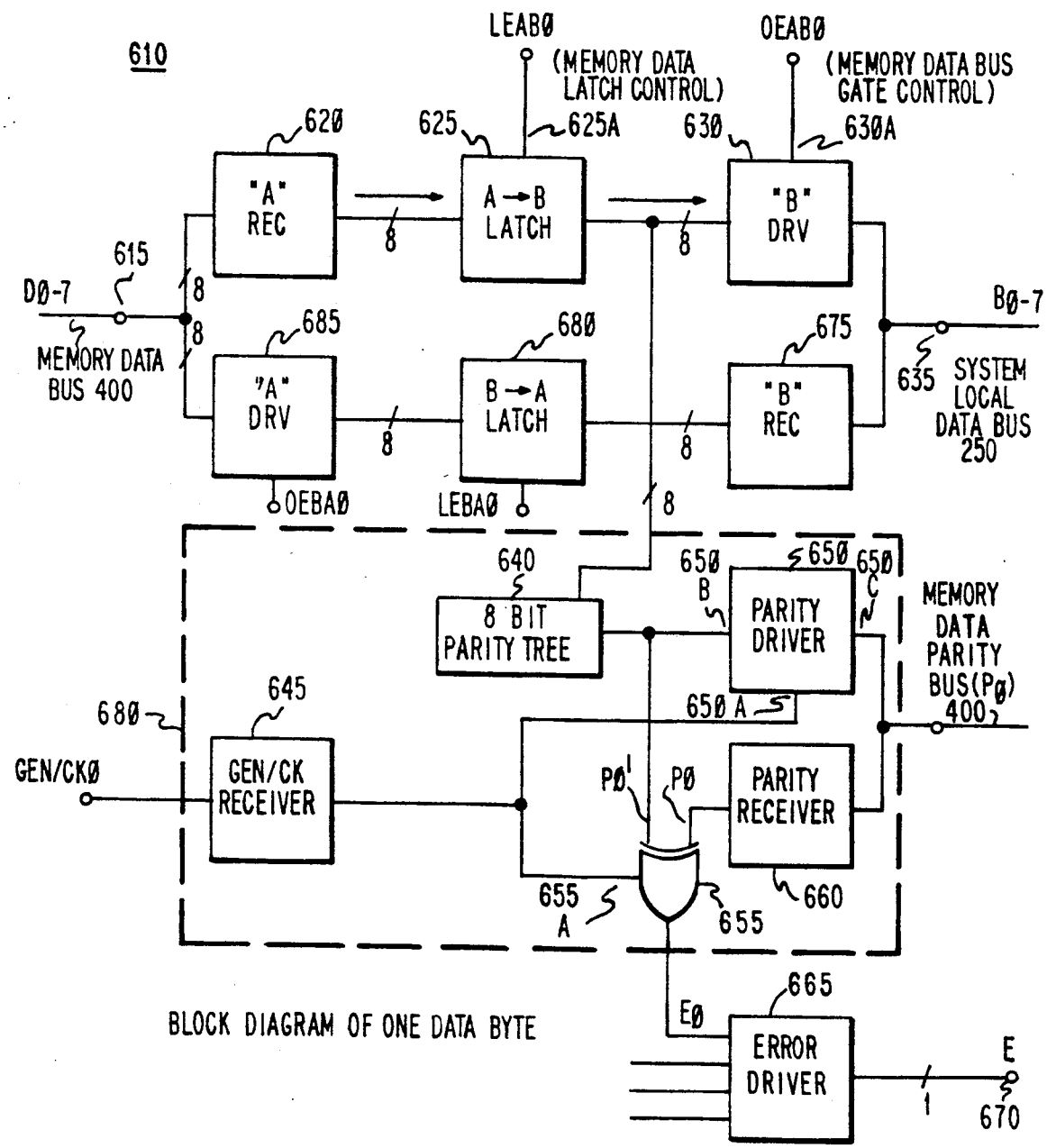
FIG. 7 is a block diagram of the bi-directional latching circuit employed in the computer system of FIG. 4.

One high speed latching type data buffer which may be employed as data buffer 355 is shown in FIG. 7 in block diagram form. For clarity of illustration, FIG. 7 shows one of four substantially identical modules employed in data buffer 355 as module 610. Buffer module 610 includes an 8 bit port 615 which is coupled to data lines $D_0$ through $D_7$ of the memory data bus 400. Buffer module 610 includes a data receiver 620 designated A REC which is coupled to port 615 as shown. Data receiver 620 is a buffer which acts as an interface between the 0 to 5 volt TTL signal environment present on memory data bus 400 and the 0 to approximately 3 volt environment characteristic of the internal workings of buffer module 610. The output of receiver 620 is coupled to the input of an 8 bit data latch 625 which latches data presented thereto when instructed to do so by an appropriate memory data latch control signal presented to its control input 625A designated LEAB0 (Latch Enable A to B). Latch 625 is a transparent latch. That is, latch 625 is operable in either a transparent mode or a latch mode in response to an appropriate control signal at control input 625A. When latch 625 is instructed to assume the transparent mode, a low input causes a low output and a high input causes a high output. That is, when in transparent mode the 8 bit data presented to the input of latch 625 flows through to the output thereof. However, when latch 625 is instructed to assume the latch mode via the latch control signal at input 625A (LEAB0) then, when presented with a particular 8 bit input signal, the output assumes a stable state and remains in such state or latched until presented with an appropriate control signal at control input 625A.

It will be recalled from earlier discussion that immediately after the addressed data becomes valid on the memory data bus at 430 in FIG. 5B, the data is latched as at 435. An output driver 630 is coupled to the output of latch 625 as shown in FIG. 7. Driver 630 is designated "B DRV" and acts to interface the 0 through 3 volt internal environment of data buffer 610 to the external 0 through 5 volt TTL environment present at the output of driver 630. The 8 bit output of driver 630 is coupled to a port 635 which is coupled to 8 data lines designated B0–B7 of the data bus of system local bus 250. In this manner, once latch 625 has latched the data provided thereto, the system can continue processing data and the signals on memory data bus 400 ($D_0$–$D_7$) are free to change while latch 625 holds the old data for later pick up by processor 225 via system local bus 250.

Driver 630 includes a memory data bus gate control input 630A which is designated OEAB0. when the OEAB0 signal is on, driver 630 is activated to pass data therethrough. However, when the OEAB0 signal is off, driver 630 is inactivated.

The output of latch 625 is coupled to the input of an 8 bit parity tree 640. If the 8 inputs to parity tree 640 exhibit an even number of ones, then parity tree 640 generates a single bit output which is a 1 (high) to maintain odd parity. However, if the 8 inputs to parity tree 640 exhibit an odd number of ones, then parity tree 640 generates a single bit output which is 0 (low) to maintain odd parity.

Data buffer 610 includes a GEN/CK receiver 645 having an input designated GEN/CK0 as illustrated in FIG. 7. GEN/CK receiver 645 is an interface which converts 0–5 volt TTL signals at the input thereof to 0–3 volt signals at the output thereof. The value of GEN/CK0 depends on the particular type of cycle which processor 225 desires to run next. That is, the GEN/CK0 input signal (see FIG. 5B) exhibits a value of 1 (high) when a memory write cycle is to be conducted and exhibits a value of 0 (low) when a memory read cycle is to be conducted. For purposes of this example, it is assumed that the GEN/CK0 signal has a value of 0 indicating that a read cycle is to be conducted from memory. That is, the data and corresponding parity information have already been stored in memory 370 and now it is desired to access such data. For purposes of this example, it is assumed that a 32 bit word comprised of four 8 bit bytes is to be retrieved from memory 370. Four parity bits are assumed to be stored with such 32 bit word, that is, 1 parity bit being associated with each byte of the 32 bit word. It is noted that the data buffer 610 of FIG. 7 is capable of handling 1 byte (8 bits) and 1 parity bit of such 32 bit word. The remaining 3 bytes and 3 parity bits of such 32 bit word are processed by 3 other data buffers similar to data buffer 610 and shown in FIG. 8.

The output of GEN/CK receiver 645 is coupled to the control input 650A of parity driver 650. The output of parity tree 640 is coupled to the input 650B of parity driver 650 and to one input of a two input exclusive or gate 655. Parity driver output 650B is coupled to the parity line $P_0$ of the parity bus portion of memory data bus 400. It will be recalled that the 36 bit memory data bus 400 includes lines $D_0$–$D_{31}$ for the stored 32 bit word and 4 parity lines $P_0$–$P_3$ corresponding to each of the 4 parity bits associated with the 4 bytes which constitute the stored 32 bit word. In addition to being coupled to parity driver output 650C, parity line P0 is coupled via a parity receiver 660 to the remaining input of exclusive OR gate 655. The output of GEN/CK receiver 645 is coupled to a control input 655A of exclusive OR gate 655. The logic state of the signal provided to control input 655A determines whether exclusive OR gate 655 is turned on to permit signals to pass therethrough or is turned off so as not to permit signals to pass therethrough to the output of exclusive OR gate 655. The output of exclusive OR gate 655 is designated $E_0$ (error) and coupled to an error driver 665. The output of error driver 665 is coupled to an error terminal 670 which is designated E. Error driver 665 is not a part of buffer 610 and is described later.

A parity error generator/checker 680 is formed by parity tree 640, GEN/CK receiver 645, parity driver 650, parity receiver 660, exclusive OR gate 655 and error driver 665. As will be subsequently, parity generator/checker 680 operates in two modes, that is a parity generation mode when data is written to memory and a parity check mode when data is retrieved or accessed from memory 370. Since the present invention involves accessing data stored in memory 370, the parity check mode of parity generator/checker 680 is now discussed. When the GEN/CK0 input of GEN/CK receiver 645 is low (0), generator/checker circuit 680 enters the parity check mode. In contrast, when GENCK0 input is high (1), generator/checker circuit 680 enters the parity generation mode. Returning again to a discussion of the parity check mode, when receiver 645 receives a GEN/CK0 signal of 0 from the external (TTL) environment, receiver 645 interfaces that signal to its output which as already mentioned is a 0 through approximately 3 volt output. The output of receiver 645 is coupled to control input 650A of parity driver 650 such that the logical low or 0 now appearing at control input 650A causes parity driver 650 to be turned off such that the signal at the output of parity tree 640 is not passed to the parity bus line $P_0$ of the memory data bus 400. It will be recalled from the above discussion, that the function of generator/checker circuit 680 in the check mode is to in effect compare the stored parity bit P0 associated with a particular byte of data ($D_0$–$D_7$) with the actual parity $P_0'$ exhibited by that same byte after it has been retrieved from memory 370. If the memory access was accomplished successfully, the parity before the access, P0, should be the same as the parity after access, $P_0'$.

When byte $D_0$–$D_7$ is fetched from memory 370, it is received by receiver 620 and latched by latch 625. (The particular byte fetched on lines $D_0$–$D_7$ is hereinafter referred to as byte 0.) The 8 bits of byte 0 are thus latched at the output of latch 625 such that the computer system is free to proceed forward and change the signal values on the $D_0$–$D_7$ lines of memory data bus 400. When latch 625 latches, byte 0 is provided to the 8 bit parity tree 640 which derives a parity bit $P_0'$ for this just accessed byte 0. $P_0'$ is thus the actual parity exhibited by byte 0 after it has been retrieved from memory 370. The $P_0'$ parity bit is provided to one input of two input exclusive OR gate 655. It will be recalled that the remaining input of exclusive OR gate 655 is coupled via parity receiver 660 to the $P_0$ parity line of memory data bus 400. In this manner, when byte 0 is retrieved from memory 370, the parity bit $P_0$ corresponding to such byte 0 is provided to the remaining input of exclusive OR gate 655. If the $P_0$ parity bit prior to access is the same as the $P_0$ parity bit after memory access, that is both zeros or both ones, then exclusive OR gate 655 generates a 0 at its output indicating that there has been no error in retrieving the data byte, byte 0, from memory. However, if the P0 parity bit prior to memory access is not the same as the P0 prime parity bit after access, then exclusive OR gate 655 generates a 1 at its output indicating that an error has occurred in retrieving byte 0 from memory 370. The error output bit at the output of exclusive OR gate 655 is interfaced via driver 665 with logical NOR function to error output port 670 which is designated E. It is noted that when generator/checker circuit 680 is in the check parity mode, the GENCK0 signal appearing at the output of GEN/CK receiver 645 is low or 0 which activates exclusive OR gate 655. In contrast, when generator/checker circuit 680 is in the parity generation mode, the GEN/CK0 signal is high which turns off exclusive OR gate 655. The computer system regularly samples the E output 670 at the end of each memory cycle to determine if an error has occurred.

As mentioned above, data buffer/latch 610 also operates in the direction opposite that described above. That is, when the computer system performs a write to memory of a particular 32 bit word including byte 0, byte 1, byte 2 and byte 3, byte 0 of this word is transferred from system local bus 250 through buffer 610 to memory data bus 400. In more detail, the system provides byte 0 to port 635 designated B0-B7. Port 635 is coupled via a receiver 675 to an 8 bit latch 680 as shown in FIG. 7.

Receiver 675 and latch 680 are substantially identical to receiver 620 and latch 625, respectively. Latch 680 includes a memory data latch control input designated LEBA0 which when driven high or to 1 results in the latching of 8 bit data supplied to latch 680. The output of latch 680 is coupled via a driver 685 to the $D_0$–$D_7$ data lines of memory data bus 400. Driver 685 is substantially identical to driver 630 already discussed. Driver 685 includes a memory data bus gate control input OEBA0 (Output Enable B to A) which when presented with a logical 0 or low signal turns on driver 685 to permit the passage of data therethrough. To summarize the operation of receiver 675, latch 680 and driver 685 in the write to memory mode, when byte 0 is provided to port 635, receiver 675 passes the 8 bits of byte 0 to latch 680. The memory data latch control signal LEBA0 (Latch Enable B to A) then instructs latch 680 to latch the data at the output of latch 680 thus permitting the computer system to continue forward and change the signal values on data lines B0–B7 at port 635 of system local data bus 250. The OEBA0 memory data bus gate control signal provided to driver 685 goes low to turn on driver 685 thus permitting the 8 bits of byte 0 latched at the output of latch 680 to pass through to data lines $D_0$–$D_7$ of memory data bus 400. The OEBA0-3 signals mirror the write enable (WE) signal which memory controller 340 supplies to memory 370. The WE signal is high for read cycles and low for write cycles.

Figure 9:
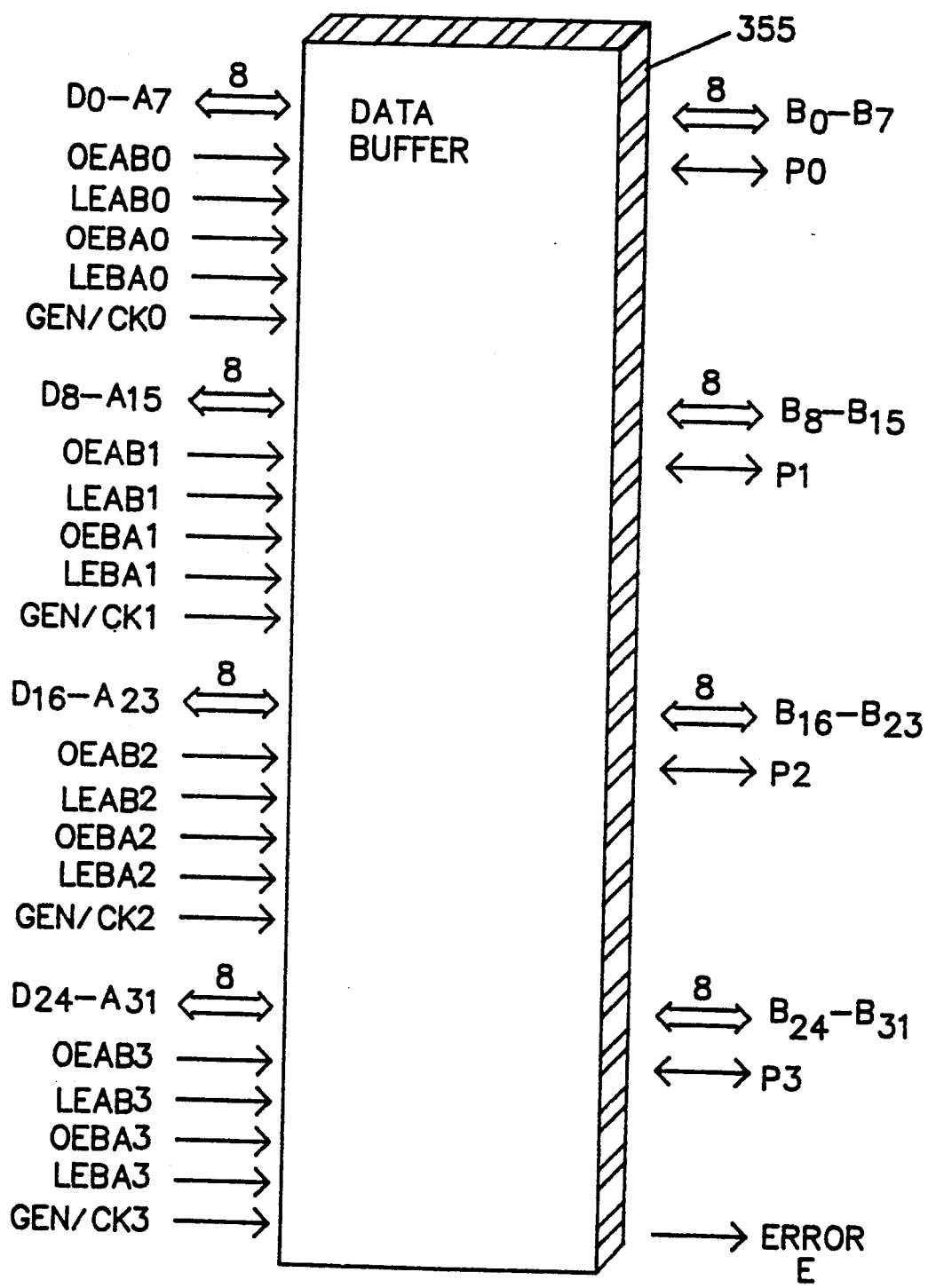
FIG. 9 is a representation of the pin-out of the data buffer of FIG. 8.

The above has been a description of the portion of data buffer 355 which is dedicated to the handling of 1 byte, B0, of a 4 byte (32 bit) word stored and retrieved from memory 370. To handle the remaining 3 bytes, byte 1, byte 2 and byte 3 of this 32 bit word, data latch/buffer 610 is replicated four times as seen in FIG. 9. For convenience, these 4 data buffers 610 are referred to as data buffer 610-0, 610-1, 610-2 and 610-3 to readily indicate that they handle the byte 0, byte 1, byte 2 and byte 3 portions of the aforementioned 32 bit word to be retrieved from or written to memory 370.

Figure 8:
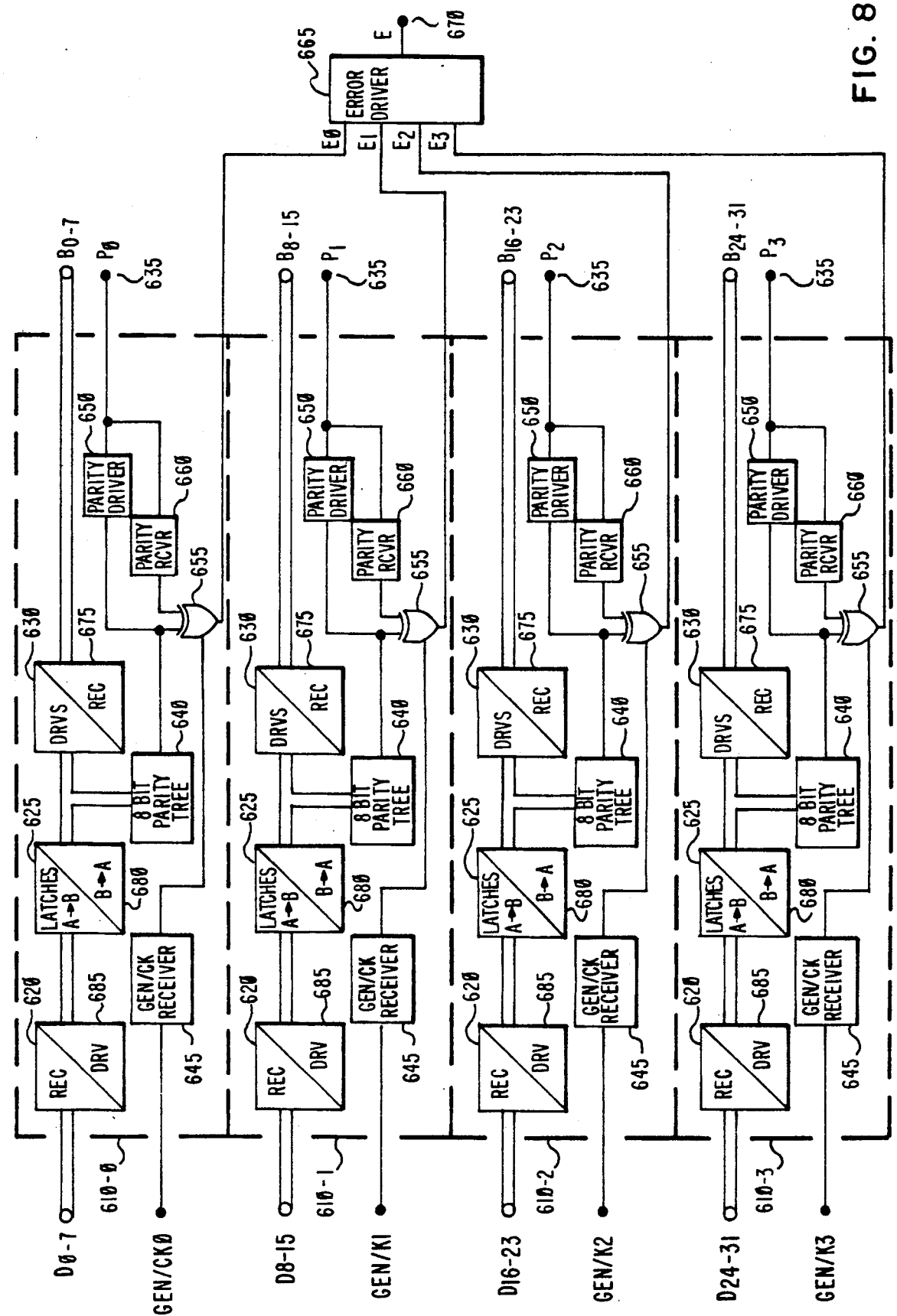
FIG. 8 is a block diagram of the complete data buffer of FIG. 7.

FIG. 8 shows a simplified block diagram of data buffer 355 as including four substantially identical data buffers/latches 610, namely, data buffers 610-0, 610-1, 610-2 and 610-3 for processing bytes 0, byte 1, byte 2 and byte 3, respectively, of a 32 bit word. Data buffer 355 is described in more detail in the above cross referenced copending patent application entitled Bidirectional Buffer with Latch and Parity Capability Gaudenzi et al U.S. patent application Ser. No. 07/198,981 filed May 26, 1988. For convenience, in FIG. 8 receiver 620 and driver 685, latches 625 and 680, and driver 630 and receiver 675 have been paired together in respective boxes in FIG. 8. It will be recalled that data buffer 355 is situated between the data bus of system local bus 250 and memory data bus 400. More specifically, the $D_0$–$D_{31}$ data lines of buffer 355 are coupled to the $D_0$–$D_{31}$ data lines of memory data bus 400. The B0–B31 data lines of buffer 355 are coupled to the B0–B31 data lines of the data bus of system local bus 250.

Whether a read or write operation is being conducted for a 32 bit word via buffer 355, buffer/latches 610-0, 610-1, 610-2 and 610-3 operate on byte 0, byte 1, byte 2 and byte 3 respectively of such 32 bit word. Data buffer 355 includes 4 parity bit input/outputs P0, P1, P2 and P3 corresponding to the generated or accessed parity of byte 0, byte 1, byte 2 and byte 3, respectively. The P0, P1, P2 and P3 parity lines of data buffer 355 are coupled to the P0, P1, P2 and P3 parity lines of the 36 line memory data bus 400. It will be recalled that memory data bus 400 includes data lines $D_0$–$D_{31}$ and parity lines P0–P3. Thus, when a particular 32 bit word is written to memory, the respective parity trees 640 of data buffers 610 0-3 determine the parity associated with each of the four bytes, byte 0–byte 3 of the 32 bit data word and supply the four determined parity bits to parity lines P0–P3 for storage in memory 370. When a retrieve operation is done to retrieve a 32 bit word from memory 370, the 4 parity bits P0–P3 associated with such data word are retrieved and supplied to the P0–P3 parity lines of data buffer 355.

The GEN/CK0, GEN/CK1, GEN/CK2 and GEN/CK3 lines of data buffer 355 are coupled to corresponding GENCK0–GENCK3 control lines (not shown) included in memory control circuit 340. Memory control circuit 340 generates a GEN/CK signal such as the GEN/CK0 signal shown in FIG. 5B and supplies the same to the GENCK0–GENCK3 inputs of buffer 355 to instruct 355 as to whether a read or write operation is being conducted. If a write operation is being conducted, then appropriate GENCK0–GENCK3 signals are produced to instruct the respective buffer 610-1 through 610-3 to generate respective parity bits corresponding to the 4 bytes of the 32 bit word being written to memory 370. However, if a read operation is being conducted, then the memory control circuit 340 generates appropriate GENCK0–GENCK3 control signals to instruct the respective buffers 610-1 through 610-3 to perform the parity check mode as already discussed in the discussion of FIG. 7. That is, after retrieving the 4 bytes and their respective 4 parity bits $P_0$–$P_3$ from memory 370, parity trees 640 determine the parity $P_0'$–$P_3'$ of the 4 bytes after retrieval, respectively. If any of the $P_0$–$P_3$ old parity bits failed to match the corresponding $P_0'$–$P_3'$ new parity bits, then an error signal is produced on the corresponding error line E0–E3 depicted in FIG. 9 at the inputs of error driver 665. Error driver 665 performs a NOR logic function. If any of error lines E0, E1, E2 and E3 receive an error signal, then the output of error driver 665 also generates such error signal. It is noted that error driver 665 interfaces the low voltage swing environment internal to buffer 355 with the external TTL environment presented to error terminal 670 designated E.

FIG. 9 is a representation of the pin-out of data buffer 355 showing the various inputs and outputs of buffer 355 already discussed above.

Table 1 is included herein to summarize the different states in which data buffer 355 is capable of operating.

TABLE 1

| 0-3 0-3 | OEBA 0-3 | LEBA 0-3 | LEBA 0-3 | A-B | B-A | | |
|---|---|---|---|---|---|---|---|
| 0 | X | 0 | X | 1 | X | 1 | Transparent Mode |
| 0 | X | 1 | X | 2 | X | 2 | Data Latched |
| 1 | X | 0 | X | 3 | X | 3 | Output Disabled |
| 1 | X | 1 | X | 4 | X | 4 | Output Disabled/ Data Latched |
| X | 0 | X | 0 | X | 1 | | |
| X | 0 | X | 1 | X | 2 | | |
| X | 1 | X | 0 | X | 3 | | |
| X | 1 | X | 1 | X | 4 | | |

Table 2 is included herein to summarize the different states which buffer 355 assumes in response to different GEN/CK signals.

TABLE 2

| GEN/CKx | Px |
| --- | --- |
| 0 | Check Mode Px Input is Compared to Internally Generated Parity Bit for the 8 Corresponding "A" Inputs. Mismatch Drives Error Line Low. |
| 1 | Generate Mode-Parity Bit is Driven Out of Output as Follows: 1 If Even Number of 1's on Corresponding "A" Inputs 0 If Odd Number of 1's. |

Note: Error Output = "1" if GEN/CK 0–3 = 1.

The OEAB0–3 and GEN/CK0–3 pins on data buffer 355 are coupled together and thus the OEAB (memory data bus gate control) signals mirror or track the GEN/CK signals as seen in FIG. 5B.

While a computer system apparatus has been described above which exhibits decreased memory access times, a method for accessing memory in such computer system is also described and is summarized below. This method is used in a computer system including a page mode memory having an address bus and a data bus coupled thereto and further having first, second and subsequent memory cycles associated therewith. More specifically a method for reading information stored in said memory is provide which includes the steps of providing to the memory an address signal corresponding to the location of data to be accessed in the memory. The method includes the steps of supplying the memory with a row address strobe (RAS) signal during the first memory cycle and applying a column address strobe (CAS) signal to the memory during the first memory cycle and subsequent to the RAS signal. The method includes latching the memory thus addressed for later transfer on the data bus and performing a CAS precharge on the memory subsequent to the latching step and prior to the end of a first memory cycle.

The foregoing has been a discussion of a computer system in which access time of page mode memory has been significantly reduced by advancing the CAS precharge associated with data to be accessed in the next memory cycle into the current memory cycle. The computer system is capable of operating at high clock speeds without resorting to additional wait states while accessing page mode memory.

While one embodiment of the invention has been described above by way of illustration, various changes and modifications will be apparent to those skilled in the art without departing from the true spirit of the invention. It is intended that all such changes and modifications fall within the scope of the invention expressed in the appended claims.

We claim:

1. A computer system comprising:
  a page mode memory having an address bus and a data bus coupled thereto;
  processing means, coupled to said address bus and said data bus, for processing data in said system and for providing said memory with a first address signal during a first memory cycle, said first address signal corresponding to a location in memory of data to be accessed;
  first control means, coupled to said memory, for supplying said memory with a row address strobe (RAS) signal during said first memory cycle;
  second control means, coupled to said emory, for supplying a column address strobe (CAS) signal to said memory during said first memory cycle and subsequent to said RAS signal;
  latching means, coupled between said memory and said data bus, for latching the data thus addressed for later transfer on said data bus;
  CAS precharge means, coupled to said memory, for subjecting said memory to a CAS precharge subsequent to said latching means latching said data and prior to the end of said first memory cycle.

2. The computer system of claim 1 wherein said system further comprises means for providing said memory with a second address signal corresponding to data in memory to be accessed during a second memory cycle subsequent to said first memory cycle, said second address signal being provided to said memory prior to the end of said first memory cycle.

3. In a computer system including a page mode memory having an address bus and a data bus coupled thereto and further having first, second a subsequent memory cycles associated therewith, a method for reading information stored in said memory comprising the steps of:
  providing to said memory an address signal corresponding to the location of data to be accessed in said memory;
  supplying said memory with a row address strobe (RAS) signal during said first memory cycle;
  applying a column address strobe (CAS) signal to said memory during said first memory cycle and subsequent to said RAS signal;
  latching the data thus addressed for later transfer on said data bus;
  performing a CAS precharge on said memory subsequent to said latching step and prior to the end of said first memory cycle.

4. In a computer system including a processor coupled to a page mode memory via an address bus and a data bus and further having first, second and subsequent memory cycles associated therewith, a method for transferring data from said memory to said processor while avoiding the addition of wait states, said data being stored in said memory in rows and columns, said method comprising the steps of:
  providing to said memory the address of a row in which data to be accessed is located;
  supplying to said memory a row address probe (RAS) signal during said first memory cycle:
  providing to said memory the address of a column in which the data to be accessed is located, this step occurring in time during said first memory cycle and subsequent to said supplying of said RAS signal;
  applying a column address strobe (CAS) signal to said memory during said first memory cycle to complete the addressing of said data;
  latching the data thus addressed for later transfer on said data bus, and
  performing a CAS precharge on said memory subsequent to said latching step and prior to the end of said first memory cycle.

5. In a computer system including a page mode memory for storing data wherein a first access of a page of memory occurs during a current memory cycle and a second access of said page of memory occurs during a next memory cycle, said second access having a CAS precharge associated therewith, a method of memory control comprising:
  latching, prior to CAS precharge, data from said first access to preserve the data for later transfer, and
  advancing the CAS precharge associated with said second access from said next memory cycle into said current memory cycle.

* * * * *